United States Patent
Koyama

[11] Patent Number: 6,093,654
[45] Date of Patent: Jul. 25, 2000

[54] PROCESS FOR FORMING INTERCONNECTION OF SEMICONDUCTOR DEVICE AND SPUTTERING SYSTEM THEREFOR

[75] Inventor: Kazuhide Koyama, Kanagawa, Japan

[73] Assignee: Sony Corporation, Tokyo, Japan

[21] Appl. No.: 08/910,624

[22] Filed: Aug. 13, 1997

[30] Foreign Application Priority Data

Aug. 13, 1996 [JP] Japan ................................ 8-231317

[51] Int. Cl.[7] ............................................... H01L 21/302
[52] U.S. Cl. .......................... 438/715; 438/622; 438/706; 438/710; 438/723
[58] Field of Search ..................................... 438/715, 622, 438/706, 710, 723; 204/298.15, 192.1, 298, 192

[56] References Cited

U.S. PATENT DOCUMENTS

| | | | |
|---|---|---|---|
| 4,184,933 | 1/1980 | Morcom et al. | 204/192 EC |
| 4,851,101 | 7/1989 | Hutchinson | 204/298 |
| 4,909,314 | 3/1990 | Lamont, Jr. | 165/80.3 |
| 5,024,747 | 6/1991 | Turner et al. | 204/298.09 |
| 5,281,320 | 1/1994 | Turner et al. | 204/298.15 |
| 5,447,613 | 9/1995 | Ouellet | 204/192.1 |
| 5,851,920 | 12/1998 | Taylor et al. | 438/648 |

*Primary Examiner*—John F. Niebling
*Assistant Examiner*—Lynne A. Gurley
*Attorney, Agent, or Firm*—Hill & Simpson

[57] ABSTRACT

A process of forming an interconnection of a semiconductor device, which is intended to prevent re-oxidation of a Si-rich layer formed on the surface of an insulating layer when the surface of the insulating layer is subjected to sputter-etch cleaning, whereby the degree of crystal orientation of an interconnection material layer formed on the insulating layer is improved. The process includes a first step of forming an insulating layer made of a silicon based material on a base body; a second step of sputter-etch cleaning the surface of the insulating layer; a third step of depositing an interconnection material layer on the insulating layer by sputtering; and a fourth step of patterning the interconnection material layer on the insulating layer, thereby forming an interconnection; wherein the sputter-etch cleaning in the second step is performed while the base body is cooled.

6 Claims, 10 Drawing Sheets

FIG. 1A SPUTTER-ETCH CLEANING
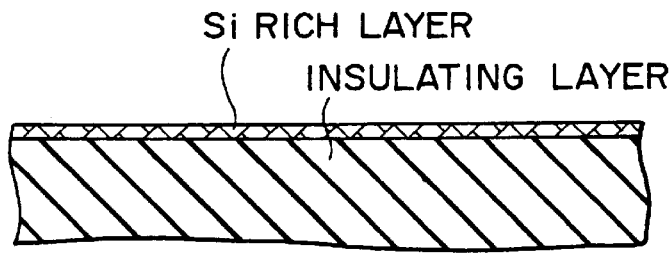
FIG. 1B FORMATION OF INTERCONNECTION MATERIAL LAYER (Ti LAYER)
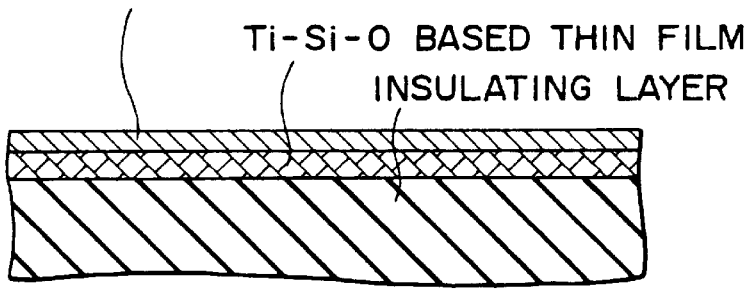
FIG. 1C FORMATION OF INTERCONNECTION MATERIAL LAYER (TiN LAYER, Al BASED LAYER)
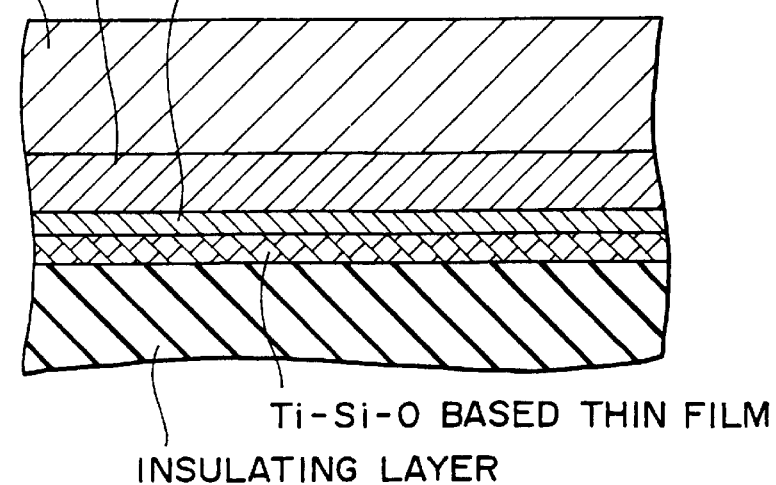

[STEP-100]

[STEP-110]

[STEP-120]

[STEP-150]

[STEP-200]

[STEP-210]

[STEP-230]

[STEP-240]

PROCESS FOR FORMING INTERCONNECTION OF SEMICONDUCTOR DEVICE AND SPUTTERING SYSTEM THEREFOR

BACKGROUND OF THE INVENTION

The present invention relates to a process of forming an interconnection of a semiconductor device and a sputtering system therefor.

The higher integration of semiconductor devices requires the design rule of finer-geometries, and to meet such a requirement, interconnections of semiconductor devices are also required to be formed at a high reliability, particularly at a high electromigration resistance. In particular, for an interconnection layer typically made of aluminum or an aluminum alloy (hereinafter, referred to generally as "an aluminum based alloy"), it is well known that the electromigration resistance thereof is strongly dependent on the degree of crystal orientation of the aluminum based alloy layer along the (111) face or the crystal particle size thereof [see "Improvement in the Electromigration Lifetime Using Hyper-Textured Aluminum Formed on Amorphous Tantalum-Aluminum Underlayer," H. Toyoda, et al., THE 32TH IRPS, IEEE, p178–184 (1994) and "Effects of Grain Size and Preffered Orientation on the Electromigration Lifetime of Al-based layered Metallization," Seiichi Kondo, et al., Journal of Applied Physics, 78, p6534–6538 (1995)].

The finer-geometries of an interconnection possibly causes stress-migration in which the interconnection is disconnected due to stress applied from an insulating layer. To prevent occurrence of stress-migration, there has been generally adopted a so-called laminated metal structure. In this structure, a layer having a high yield stress, which is made of a high melting point metal such as Ti or a high melting point metal compound such as TiN or a conductive metal layer or metal compound layer, is previously formed under an interconnection made of an aluminum based alloy, whereby disconnection of the entire interconnection is prevented by the redundant effect of such a layer. This redundant effect will be shown in FIG. 9. In addition, a high melting point metal layer or the like formed under an interconnection made of an aluminum based alloy is hereinafter referred to generally as "a metal backing layer".

It becomes apparent that the crystal orientation of an aluminum based alloy is largely dependent on the crystal orientation of a metal backing layer and a lattice conformity with crystals of the metal backing layer. In particular, titanium (Ti) generally used for a metal backing layer has the (0002) face as the priority orientation face which is good in lattice conformity with the (111) face of crystals of aluminum. It is reported that as the degree of crystal orientation of a metal backing layer of Ti along the (0002) face becomes higher, the degree of crystal orientation of an aluminum based alloy layer formed thereon along the (111) face becomes higher [see "Formation of Texture Controlled Aluminum and Its Migration Performance in Al—Si/TiN Stacked Structure," Makiko Kageyama, et al., The 29th IRPS, IEEE, p97–101 (1991)]. The same is true for the case where a TiN layer having crystals orientated along the (111) face is formed between the Ti layer and the aluminum based alloy layer. That is, for a metal backing layer having a laminated structure of Ti/TiN, as the degree of crystal orientation of the metal backing layer becomes higher, the degree of crystal orientation of an aluminum based alloy layer formed thereon along the (111) face becomes higher. As a result, the reliability of an interconnection made of such an aluminum based alloy layer can be enhanced.

The degree of crystal orientation of a metal backing layer is largely affected by a surface state of an insulating layer on which the metal backing layer is to be formed. In general, for ensuring electric connection with a connection hole such as a contact hole or a via-hole, the surface of an insulating layer is subjected to sputter-etch cleaning before formation of a metal backing layer. And, a metal backing layer and an aluminum based alloy layer are deposited at a reduced pressure by sputtering using the same system.

When the surface of an insulating layer mainly containing $SiO_2$ is subjected to sputter-etch cleaning, a Si-rich layer is formed on the surface of the insulating layer. In this case, if a metal backing layer is made of titanium, a thin film made of a Ti—Si—O based material being rich in Ti, which is similar to silicide, is formed near the boundary between the insulating layer and the metal backing layer [see "Influence of Under-metal Planes on Al (111) Crystal Orientation in Layered Al Conductors", H. Shibata, et al., 1991 VLSI Symp. pp33–34]. Ti atoms are easily re-arranged at the step of forming such a thin film, and consequently Ti crystals are strongly orientated along the (0002) face as the priority orientation face. As a result, the degree of crystal orientation of an aluminum based alloy layer becomes higher. The reliability of an interconnection made of such an aluminum based alloy layer can be thus enhanced.

However, in the case where the atmosphere contains oxygen in a high concentration upon sputter-etch cleaning and in a period until a metal backing layer is formed, a Si-rich layer formed on the surface of the insulating layer upon sputter-etch cleaning is immediately re-oxidized. In particular, since temperature rise due to plasma is given upon sputter-etch cleaning, discharge of gas from an insulating layer and various jigs provided in the sputter-etch cleaning chamber becomes higher, and thereby the Si-rich layer on the surface of the insulating layer is liable to be re-oxidized. As a result, it is hard to form a thin layer made of a Ti—Si—O based material being rich in Ti near the boundary between the insulating layer and metal backing layer. Thus, there occurs a problem that the degree of crystal orientation of the aluminum based alloy layer along the (111) face is lowered.

SUMMARY OF THE INVENTION

An object of the present invention is to provide a process of forming an interconnection of a semiconductor device capable of preventing re-oxidation of a Si-rich layer which is formed on the surface of a silicon-based material made insulating layer formed on a base body when the surface of the insulating layer is subjected to sputter-etch cleaning, thereby improving the degree of crystal orientation of an interconnection material layer formed on the insulating layer, and a sputtering system suitable for carrying out the process of forming an interconnection of a semiconductor device.

To achieve the above object, according to a first aspect of the present invention, there is provided a process of forming an interconnection of a semiconductor device, including: a first step of forming an insulating layer made of a silicon based material on a base body; a second step of sputter-etch cleaning the surface of the insulating layer; a third step of depositing an interconnection material layer on the insulating layer by sputtering; and a fourth step of patterning the interconnection material layer on the insulating layer, thereby forming an interconnection; wherein the sputter-etch cleaning in the second step is performed while the base body is cooled.

In the above process, the temperature of the base body in the second step is preferably controlled to be 100° C. or less. The lower limit of the temperature of the base body is depended on the specification of the system used for carrying out the process and the throughput, and is preferably set at about −40° C.

The above process preferably further includes, between the first and second steps, a step of degassing the insulating layer by heating the insulating layer. The degassing step is effective to further effectively prevent re-oxidation of a Si-rich layer formed on the surface of the insulating layer when the surface of the insulating layer is subjected to sputter-etch cleaning, and to prevent entrapment of impurities discharged from the insulating layer in the atmosphere required for film formation of the interconnection material layer and hence to further effectively improve the degree of crystal orientation, surface state or burying performance of the interconnection material layer. In addition, the heating temperature upon degassing of the insulating layer is preferably higher than the temperature of the insulating layer upon formation of the interconnection material layer by sputtering in the third step. This is effective to positively prevent discharge of gas from the insulating layer when the interconnection material layer is formed at the third step.

In the above process, preferably, the base body is kept under a reduced pressure (for example, $1 \times 10^{-6}$ Pa or less, excluding the pressure during sputtering) in a period from the start of the second step to the end of the third step. This is effective to prevent adsorption of moisture and impurities in the atmospheric air on the surface of the insulating layer.

According to a preferred mode of the above process, an opening portion is formed in the insulating layer formed on the base body and buried with a metal material in the first step, and the interconnection material is formed on the insulating layer including the upper portion of the metal material buried in the opening portion by sputtering in the third step.

According to another mode of the above process, an opening portion is formed in the insulating layer formed on the base body in the first step, and in the third step, the interconnection material is formed by sputtering on the insulating layer including the interior of the opening portion and the opening portion is buried with the interconnection material layer by heating the interconnection material layer. In the case, the interconnection material layer is preferably heated at a pressurized state. According to a further mode of the above process, an opening portion is formed in the insulating layer formed on the base body in the first step, and in the third step, during formation of an interconnection material layer on the insulating layer including the interior of the opening portion by sputtering, the opening portion is buried with the interconnection material layer by heating the interconnection material layer.

In the above process, preferably, the interconnection material layer is of a structure including a metal backing layer made of at least Ti and an aluminum based alloy layer or a metal layer formed on the metal backing layer; a structure of a Ti single layer; or a laminated structure of a Ti layer and a TiN layer. In the structure of the metal backing layer and the aluminum base alloy layer or metal layer, the metal backing layer may be of a Ti single layer structure, a double layer structure of TiN (upper layer)/Ti (lower layer), or a triple layer structure of Ti/TiN/Ti. TiN may be replaced with TiON. The aluminum based alloy layer may be made of pure aluminum, or an aluminum alloy such as Al—Cu, Al—Si, Al—Si—Cu, Al—Ge, or Al—Si—Ge. The metal layer may be made of Cu. The metal material to be buried in the opening portion is represented by tungsten or copper.

Specific examples of the base body include a transistor element, isolation region, lower insulating layer formed on a transistor element, and a lower insulating layer formed on a transistor element and a lower interconnection layer formed on the lower insulating layer. The insulating layer may be made of a material selected from the known silicon based materials such as $SiO_2$, BPSG (Boron Phospho Silicate Glass), PSG (Phospho Silicate Glass), BSG (Boro Silicate Glass), AsSG (Arsenic Silicate Glass), PbSG (Pb Silicate Glass), SbSG (Sb Silicate Glass), NSG (Nondoped Silicate Glass), SOG (Spin On Glass), LTO (Low Temperature Oxide, Low temperature $CVD-SiO_2$), SiN (Silicon Nitride) and SiON. Alternately, the interconnection material layer may be formed of a laminated structure of these materials. As the sputtering process in the present invention, there may be used a magnetron sputtering process, DC sputtering process, DC magnetron sputtering process, RF sputtering process, ECR sputtering process, or bias sputtering process applying a bias on a base body.

To achieve the above object, according to a second aspect of the present invention, there is provided a sputtering system including: a sputter-etch cleaning chamber for sputter-etch cleaning the surface of an insulating layer formed on a base body, the sputter-etch cleaning chamber including a cooling means for cooling the base body; a sputtering chamber for depositing an interconnection material layer on the insulating layer by sputtering; and a carrying path for connecting the sputter-etch cleaning chamber to the sputtering chamber, the carrying path being kept under a reduced pressure.

The above sputtering system preferably further includes a degassing chamber for degassing the insulating layer formed on the base body by heating the insulating layer.

In the present invention, since the sputter-etch cleaning is performed while a base body is cooled, it is possible to suppress discharge of gas from an insulating layer and various jigs provided in the sputter-etch cleaning chamber even when temperature rise due to plasma is given thereto, and hence to prevent re-oxidation of a Si-rich layer on the surface of the insulating layer. Such a state of the insulating layer is shown in FIG. 1A. For example, for an interconnection material layer having a metal backing layer of Ti (lower layer)/TiN (upper layer) and an aluminum based alloy layer formed thereon, a thin film made of a Ti—Si—O based material being rich in Ti is liable to be formed near the boundary between the insulating layer and the metal backing layer, so that Ti crystals of the Ti layer are strongly oriented along the (0002) face. The states of the insulating layer and the Ti layer are shown in FIG. 1B. Eventually, the degree of crystal orientation of the aluminum based alloy layer along the (111) face is improved. In addition, the states of the insulating layer, metal backing layer, and aluminum based alloy layer are shown in FIG. 1C. As a result, an interconnection having a high reliability can be formed.

FIG. 2 shows a relationship between a substrate temperature upon sputter-etch cleaning and an electromigration resistance of an aluminum based alloy layer. As is apparent from FIG. 2, upon sputter-etch cleaning, the lower the substrate temperature, the higher the electromigration resistance. In FIG. 2, the ordinate indicates an average time elapsing until disconnection of an interconnection due to electromigration, and the abscissa indicates a setting temperature of a semiconductor substrate. The temperature of the semiconductor substrate is increased several tens of ° C.

during plasma processing upon sputter-etch cleaning. In FIG. 2, the black mark "sputter-etch cleaning, absence" indicates a state in which the substrate is placed in the sputter-etch cleaning chamber and is subjected to only pre-heating.

BRIEF DESCRIPTION OF THE DRAWINGS

FIGS. 1A, 1B and 1C are partial sectional views each typically showing a structure of a semiconductor device including an insulating layer and the like for illustrating the principle enabling formation of an interconnection having a high reliability;

FIGS. 11A and 11B are views illustrating a collimated sputtering process, wherein FIG. 11A is a concept view of a sputtering system, and FIG. 11B is a typical perspective view of a collimator.

DETAILED DESCRIPTION OF THE PREFERRED EMBODIMENT

Hereinafter, a preferred embodiment of the present invention will be described with reference to the accompanying drawings.

First, there will be described a sputtering system according to one embodiment of the present invention, which is suitable for carrying out a process of forming an interconnection of a semiconductor device according to the present invention. The sputtering system in this embodiment is of a multi-chamber type capable of performing at least four kinds of treatments. It is to be noted that the sputtering system may be of a cluster-tool type enabling random access.

Figure 2:
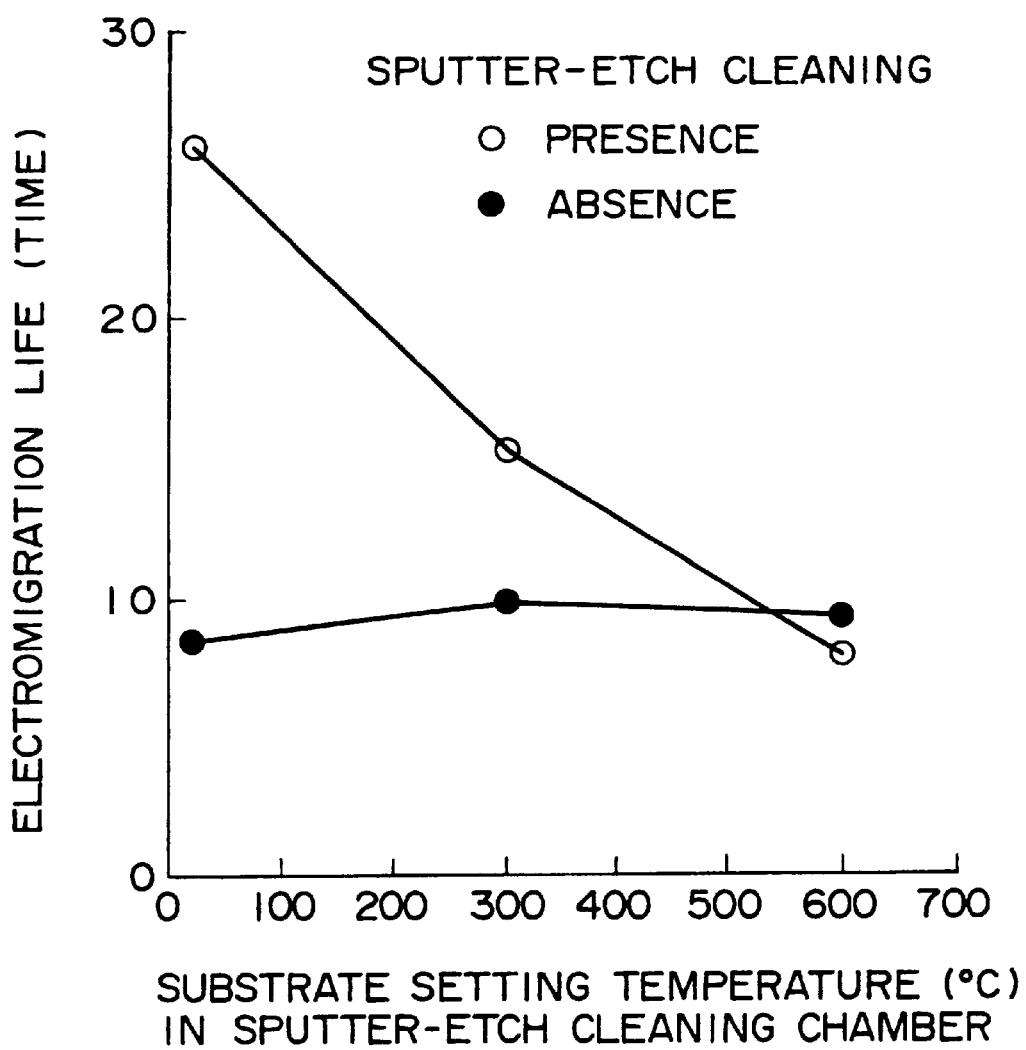
FIG. 2 is a graph showing a relationship between a substrate temperature upon sputter-etch cleaning and an electromigration resistance of an aluminum based alloy layer.
Figure 3:
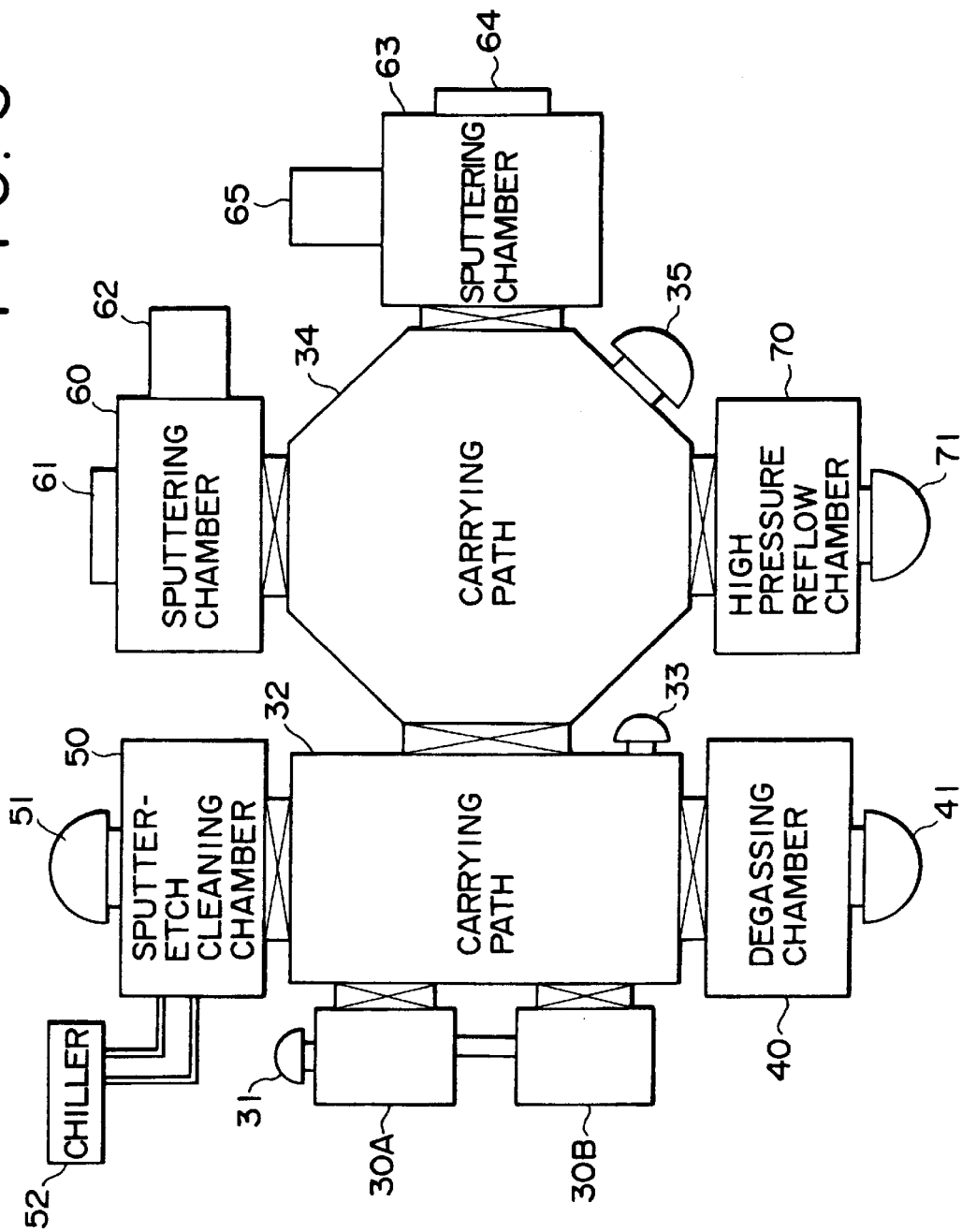
FIG. 3 is a schematic view showing the concept of a sputtering system according to one embodiment of the present invention.

FIG. 3 is a schematic view showing the concept of the sputtering system in this embodiment. Referring to this figure, the sputtering system includes loading chambers 30A and 30B for carrying a semiconductor substrate in and out of the system; a carrying path composed of a first carrying path 32 and a second carrying path 34; a degassing chamber 40; a sputter-etch cleaning chamber 50; a first sputtering chamber 60 and a second sputtering chamber 63; and a high pressure reflow chamber 70. The loading chamber 30A is communicated to the loading chamber 30B through piping. A turbo-molecular pump 31 is disposed in the loading chamber 30A, so that the interiors of the loading chambers 30A and 30B can be evacuated to high vacuum. The first carrying path 32 is communicated to the loading chambers 30A and 30B, degassing chamber 40, sputter-etch cleaning chamber 50, and second carrying path 34 through gate valves. A turbo-molecular pump 33 is disposed in the first carrying path 32 for evacuating the interior thereof to high vacuum.

A turbo-molecular pump 35 is disposed in the second carrying path 34 for evacuating the interior thereof to a high vacuum. The second carrying path 34 is communicated to the first sputtering chamber 60, second sputtering chamber 63, and high pressure reflow chamber 70 through gate valves. A cathode 61 and a cryopump 62 are disposed in the first sputtering chamber 60, while a cathode 64 and a cryopump 65 are disposed in the second sputtering chamber 63. A turbo-molecular pump 71 is disposed in the high pressure reflow chamber 70.

Figure 4:
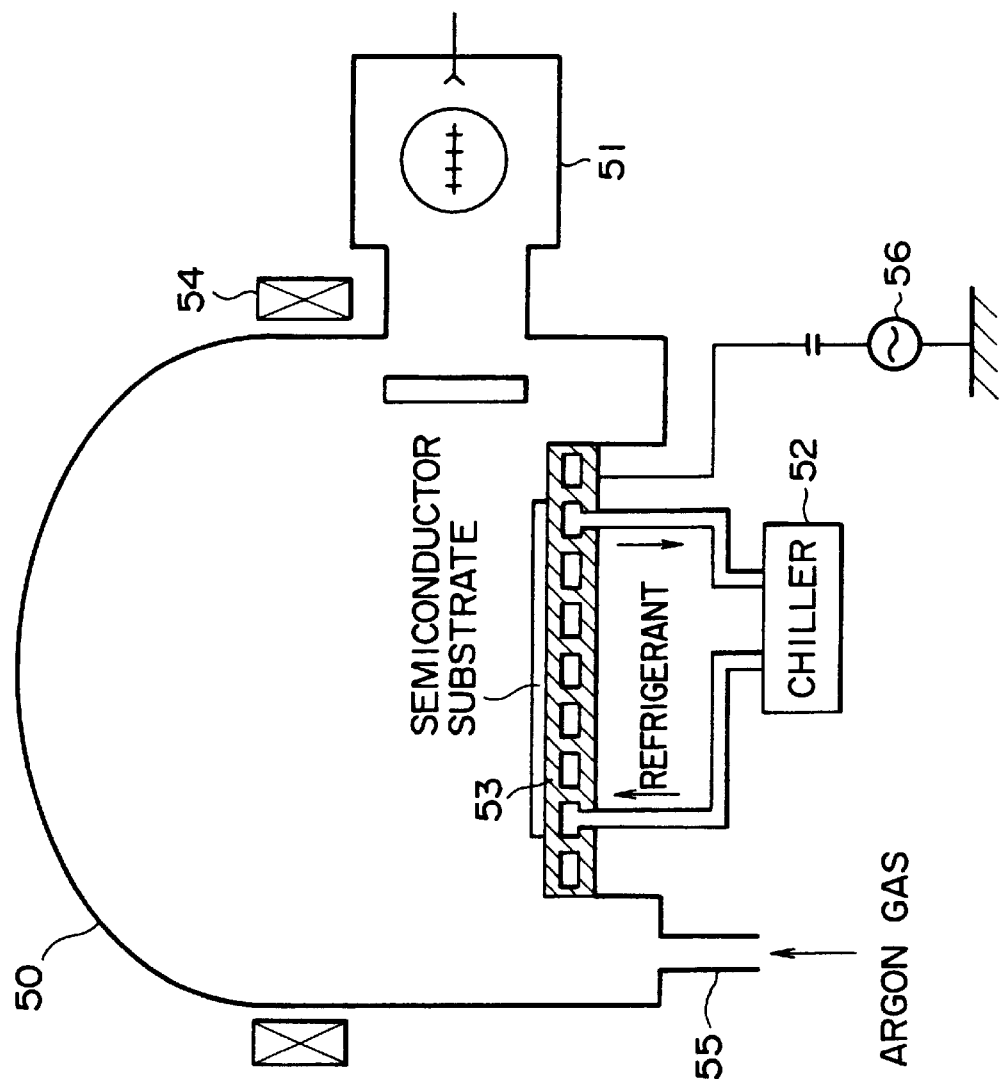
FIG. 4 is a schematic view showing the concept of a sputter-etch cleaning chamber provided in the sputtering system shown in FIG. 3.

FIG. 4 is a schematic view showing the concept of the sputter-etch cleaning chamber 50. Referring to this figure, there is shown a cooling stage 53 disposed in the sputter-etch cleaning chamber 50. The cooling stage 53 has a structure in which a refrigerant such as FLORENATE (trade name, produced by Three-M Co., Ltd.) cooled by a chiller 52 circulates therethrough. A semiconductor substrate placed on the cooling stage 53 can be thus cooled at a specific temperature. Specifically, the semiconductor substrate is fixed on the cooling stage 53 with a jig (not shown) such as an electrostatic chuck or a tab. The cooling stage 53 is applied with a RF bias voltage supplied from a RF bias power supply 56. A plasma control coil 54 and a turbo-molecular pump 51 are disposed in the sputter-etch cleaning chamber 50. Argon gas or the like is introduced in the sputter-etch cleaning chamber 50 through a gas inlet 55 and is discharged therefrom by the turbo-molecular pump 51.

The typical shift of the semiconductor substrate in the sputtering system shown in FIGS. 3 and 4 will be described below.

The semiconductor substrate, which has been put into the system through the loading chambers 30A and 30B, is carried into the degassing chamber 40 through the first carrying path 32. A turbo-molecular pump 41 is disposed in the degassing chamber 40 for discharging a gas, resulting from degassing, from the system. A quadrupole mass spectrometer (not shown) is preferably disposed in the degassing chamber 40 for detecting (analyzing) the concentration of a specific gas in the atmosphere in the degassing chamber 40 during degassing treatment. The quadrupole mass spectrometer contains a turbo-molecular pump (not shown). In the degassing chamber 40 of this embodiment, insulating layers of semiconductor substrates may be degassed in a single wafer processing mode, or in a batch type wafer processing mode for improving throughput. For the batch type, a plurality of semiconductor substrates are carried into the degassing chamber 40, being degassed, and are subjected to sputter-etch cleaning one by one in the sputter-etch cleaning chamber 50, followed by formation of metal backing layers and aluminum based alloy layers thereon. The temperature of the semiconductor substrate is preferably monitored using a pyrometer or fluorescent temperature meter (not shown) for controlling the temperature of the semiconductor substrate during degassing treatment.

The semiconductor substrate, which has been degassed, is carried into the sputter-etch cleaning chamber 50 through the first carrying path 32 and is placed on the cooling stage 53. A RF bias voltage is applied between the plasma control coil 54 and the cooling stage 53 to generate a plasma. The surface of an insulating layer formed on the semiconductor substrate is thus subjected to sputter-etch cleaning. The temperature of the semiconductor substrate is preferably monitored using a pyrometer or fluorescent temperature meter (not shown) for controlling the temperature of the semiconductor substrate during sputter-etch cleaning treatment.

The semiconductor substrate, which has been subjected to sputter-etch cleaning, is sequentially carried into the first sputtering chamber 60 for forming a metal backing layer, second sputtering chamber 63 for forming an aluminum based alloy layer, and high pressure reflow chamber 70, through the first carrying path 32 and second carrying path 34. The semiconductor substrate, which has been formed with an interconnection material layer, passes through the second carrying path 34 and first carrying path 32 and is carried out of the system from the loading chambers 30A and 30B.

Using such a sputtering system, the base body (semiconductor substrate) having been subjected to sputter-etch cleaning can be kept in vacuum in the subsequent steps. It is desired that the base body is sequentially carried from the degassing chamber 40 to the sputter-etch cleaning chamber 50, first sputtering chamber 60, second sputtering chamber 63, and high pressure reflow chamber 70 through the first carrying path 32 and second carrying path 34 without simultaneously communicating the degassing chamber 40 to the sputter-etch cleaning chamber 50, first sputtering chamber 60, second sputtering chamber 63, and high pressure reflow chamber 70 through the first carrying path 32 and second carrying path 34. Specifically, the opening/closing of each gate valve may be controlled for realizing the above state. For example, when the gate valve between the first carrying path 32 and the degassing chamber 40 is opened, the gate valve between the sputter-etch cleaning chamber 50 and the first carrying path 32 is closed, the gate valves between the second carrying path 34 and the first and second sputtering chambers 60 and 63 are closed, and the gate valve between the second carrying path 34 and the high pressure reflow chamber 70 is closed. This more positively prevents an inconvenience that a gas flows from the degassing chamber 40 into the sputter-etch cleaning chamber 50, first sputtering chamber 60, second sputtering chamber 63, or high pressure reflow chamber 70 and thereby the interior of the sputtering chamber or the like is contaminated by the gas discharged from an insulating layer. In other words, the control of opening/closing of each gate valve effectively prevents occurrence cross-contamination. It is also desired to control opening/closing of the gate valve disposed between the first carrying path 32 and the degassing chamber 40 on the basis of the detected results of the quardrupole mass spectrometer, that is, on the basis of the concentration of the gas discharged from an insulating layer. Specifically, it is desired to open the gate valve disposed between the first carrying path 32 and the degassing chamber 40 after the gas concentration detected by the quardrupole mass spectrometer is reduced to a specific value or less.

It is to be noted that the carrying means such as a carrying robot for carrying a semiconductor substrate, which is provided in the sputtering system, is omitted in the figures. In addition, the degassing chamber 40 may be omitted if degassing treatment for an insulating layer is needless, and the high pressure reflow chamber 70 may be omitted if high pressure reflow is needless.

The present invention will be more clearly understood with reference to the following examples:

EXAMPLE 1

In this example, before formation of an interconnection material layer by sputtering, the surface of an insulating layer is subjected to sputter-etch cleaning with a vacuum state being kept. The interconnection material layer has a metal backing layer composed of TiN (upper layer)/Ti (lower layer) and an aluminum based alloy layer formed on the metal backing layer. In Example 1, although a via-hole formed by burying a metal material in an opening portion is previously formed in the insulating layer and the interconnection material layer is formed on the insulating layer, the interconnection layer is not subjected to reflow treatment. Hereinafter, the process of forming an interconnection of a semiconductor substrate in this example will be described with reference to FIGS. 5A, 5B and FIGS. 6A, 6B. In addition, there is used the same sputtering system as described with reference to FIGS. 3 and 4, except that the degassing chamber 40 and the high pressure reflow chamber 70 are omitted in this example.

[Step-100]

Figure 5A:
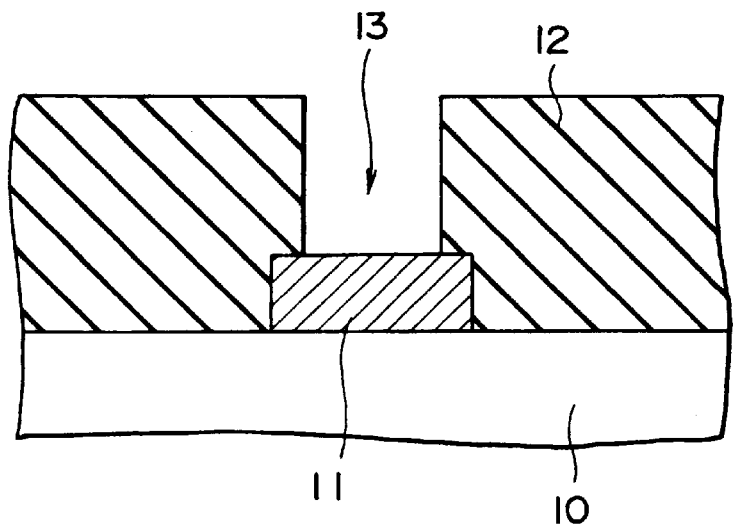
FIGS. 5A and 5B are partial sectional views each typically showing a structure of a semiconductor device including a base body and the like for illustrating steps of forming an interconnection of a semiconductor device according to a first example.

First, a transistor element is formed on a semiconductor substrate in accordance with a known process, and then a lower insulating layer 10 is formed over the entire surface. A lower interconnection layer 11 is formed on the lower insulting layer 10. An insulating layer 12 made of $SiO_2$ is then formed on the entire surface. In this example, the lower insulating layer 10 and the lower interconnection layer 11 constitute a base body. Then, an opening portion 13 is formed in the insulating layer 12 at a position over the lower interconnection layer 11 by photolithography and etching. A structure shown in FIG. 5A is thus obtained. In addition, the semiconductor substrate and the transistor element are omitted in the figures. The hole diameter of the opening portion 13 is set at 0.40 μm and the aspect ratio thereof is set at 1.8. The condition under which the insulating layer 12 is formed by plasma CVD using TEOS is as follows:

Gas used: $Si(O-C_2H_6)_4$=50 sccm

RF power=190 W

Pressure: $3.3 \times 10^2$ Pa

Substrate heating temperature: 400° C.

[Step-110]

Figure 11A:
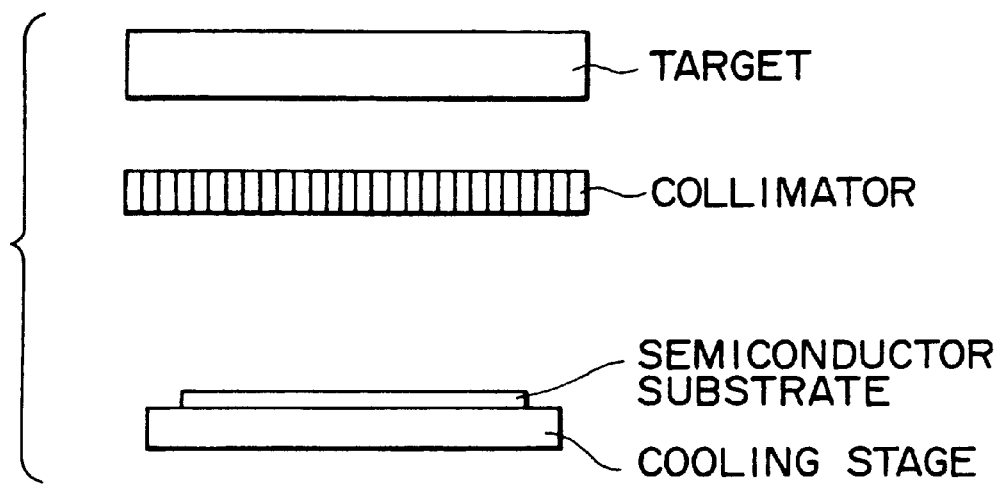
Figure 11B:
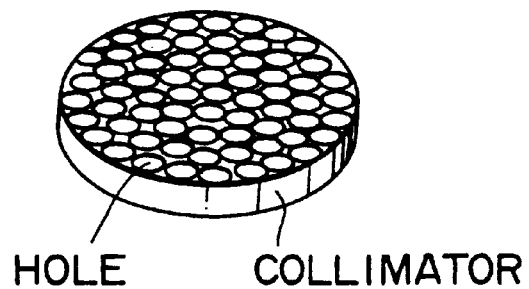

The surface of the lower interconnection layer 11 exposed at the bottom portion of the opening portion 13 is preferably subjected to sputter-etch cleaning. The opening 13 is then buried with tungsten, to form a via-hole. More specifically, an adhesive layer 14 made of TiN (thickness: 30 nm) is deposited by collimated sputtering on the insulating layer 12 including the interior of the opening portion 13. In addition, since the adhesive layer 14 made of TiN is to be removed excluding the portion formed in the opening portion 13, it is not required to be subjected to sputter-etch cleaning while the insulating layer 12 is cooled. The collimated sputtering is performed by disposing a jig (collimator) having a number of holes between a target and a semiconductor substrate as shown in FIGS. 11A and 11B, and allowing sputter particles to pass through the holes of the jig, thereby enhancing the directivity of the sputter particles. This is effective to increase vertically incident components of the sputter particles with respect to the base body, and hence to improve the coverage of the sputter particles in the opening portion having the high aspect ratio. The sputter-etch cleaning condition and the film formation condition of the adhesive layer 14 made of TiN are as follows:

(Sputter-etch cleaning condition)
  Gas used: Ar=100 sccm
  Pressure: 0.4 Pa
  RF bias: 1000 V
  Heating of substrate: not performed
  Etching time: one minute (Film formation condition of adhesive layer)
  Gas used: Ar/$N_2$=30/80 sccm
  Pressure: 0.4 Pa
  DC power=5 kW
  Substrate heating temperature: 200° C.

Figure 5B:
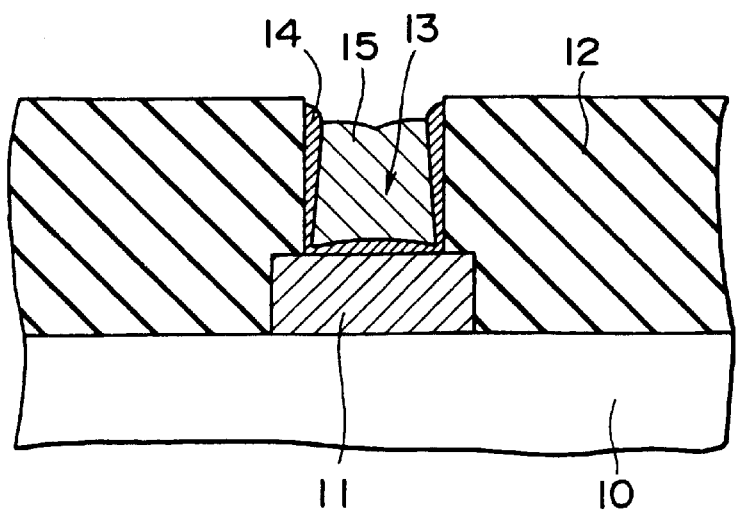

Next, a tungsten layer (thickness: 0.4 μm) is formed by CVD on the insulating layer 12 including the interior of the opening portion 13, and the tungsten layer and the adhesive layer 14 on the insulating layer 12 are etched-back, to form a via-hole 15 made of tungsten in the opening portion 13. A structure thus obtained is shown in FIG. 5B. The film formation condition of the tungsten layer and the etching-back condition are as follows:

(Film formation condition of tungsten layer)
  Gas used: $WF_6$/$H_2$/Ar=80/500/2800 sccm
  Pressure: $1.1 \times 10^4$ Pa
  Substrate heating temperature: 430° C.

(Etching-back condition)
  Gas used: $SF_6$/Ar=110/90 sccm
  Pressure: 35 Pa
  RF power: 275 W

[Step-120]

Each of the semiconductor substrates thus prepared is carried into the sputter-etch cleaning chamber 50 of the sputtering system shown in FIG. 3 through the loading chambers 30A, 30B and the first carrying path 32. Then, the surface of the insulating layer 12 is subjected to sputter-etch cleaning for removing an oxide film covering the top surface of the via-hole 15 and forming a Si-rich layer on the surface of the insulating layer 12. At this time, sputter-etch cleaning is performed while cooling the base body composed of the lower insulating layer 10 and the lower interconnection layer 11, that is, while cooling the semiconductor substrate (see FIG. 6A). The sputter-etch cleaning condition is shown in the following. In addition, the temperature of the semiconductor substrate is controlled at 0° C. for adjusting the temperature of the base body composed of the lower insulating layer 10 and the lower interconnection layer 11 at 50° C. or less upon sputter-etch cleaning. It is to be noted that the temperature of the base body is preferably controlled at 100° C. or less for positively suppressing temperature rise due to plasma upon sputter-etch cleaning.

(Sputter-etch cleaning condition)
  Gas used: Ar=100 sccm
  Pressure: 0.4 Pa
  RF bias: 1000 V
  Substrate temperature: 0° C.
  Etching time: one minute At this step, since the semiconductor substrate, base body, and jigs disposed near the cooling state 53 are cooled, temperature rise due to plasma upon sputter-etch cleaning is suppressed. As a result, it is possible to prevent such an inconvenience that the Si-rich layer (not shown) formed on the surface of the insulating layer 12 is re-oxidized by gases discharged from the semiconductor substrate, base body, and jigs.

[Step-130]

Next, an interconnection material layer is formed on the insulating layer 12 by sputtering. Specifically, the semiconductor substrate is carried from the sputter-etch cleaning chamber 50 into the first sputtering chamber 60 through the first carrying path 32 and the second carrying path 34. A metal backing layer 16 composed of a Ti layer (thickness: 20 nm) and a TiN layer (thickness: 50 nm) is then formed on the insulating layer 12 by sputtering. The metal backing layer 16 is formed for improving the crystal orientation of an aluminum based alloy layer 17 and enhancing the stress-migration resistance. The film formation condition of the TiN layer may be the same as the film formation condition of the adhesive layer at [Step-110]. The sputtering condition of the Ti layer is shown in the following. In addition, the metal backing layer 16 is shown as one layer in the figure for simplicity.

(Sputtering condition of Ti layer)
  Gas used: Ar=100 sccm
  Pressure: 0.4 Pa
  DC power: 5 kW
  Substrate heating temperature: 200° C.

[Step-140]

The semiconductor substrate is then carried into the second sputtering chamber 63 through the second carrying path 34. An aluminum based alloy layer 17 made of Al-0.5% Cu (thickness: 0.5 μm) is deposited on the metal backing layer 16 by sputtering in the following sputtering condition. It is to be noted that the flatness of the aluminum based alloy layer 17 on the via-hole 15 can be more improved at a higher substrate heating temperature.

(Sputtering condition of aluminum based alloy layer)
  Gas used: Ar=100 sccm
  Pressure: 0.4 Pa
  DC power: 20 kW
  Substrate heating temperature: 300° C.

After formation of the interconnection material layer, the semiconductor substrate is carried from second sputtering chamber 63 into the loading chambers 30A and 30B through the second carrying path 34 and the first carrying path 32, and is carried out of the system from the loading chambers 30A and 30B.

[Step-150]

Figure 6A:
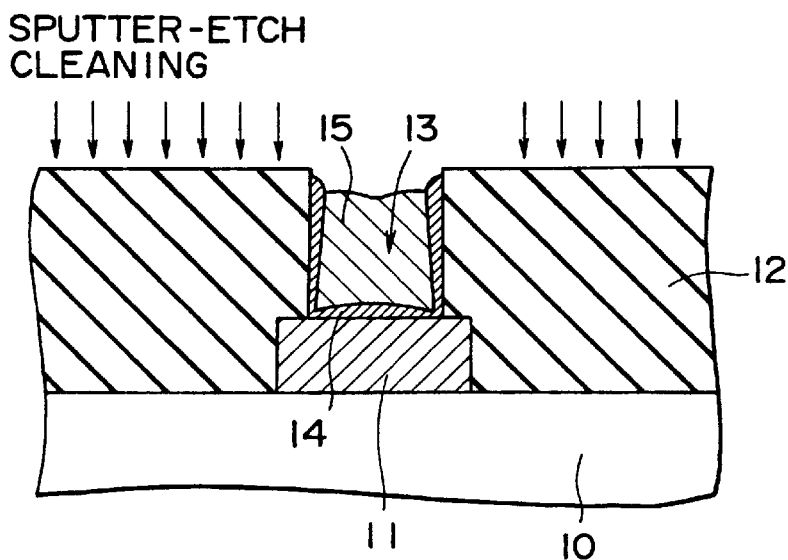
FIGS. 6A and 6B are partial sectional views, similar to FIGS. 5A and 5B, for illustrating steps continued from the step shown in FIGS. 5A and 5B.
Figure 6B:
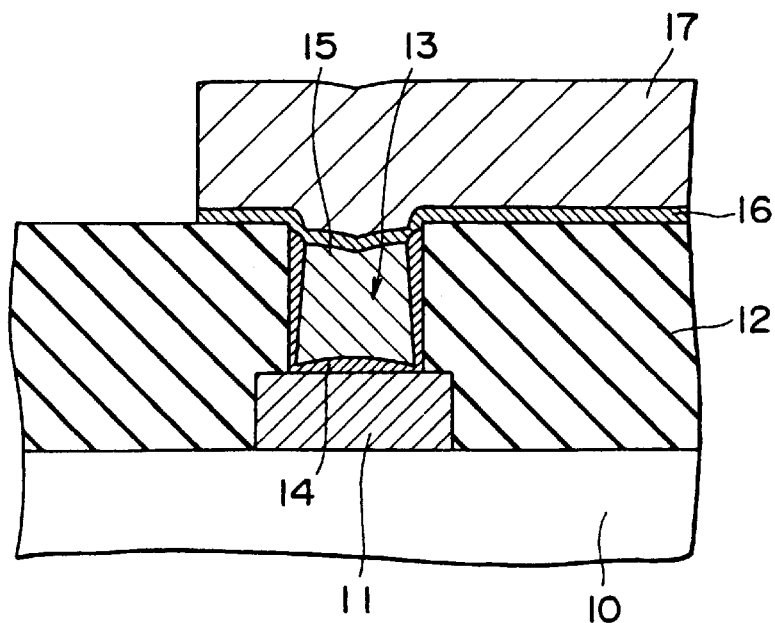

After that, the aluminum based alloy layer 17 and the metal backing layer 16 on the insulating layer 12 are patterned to form an interconnection. Specifically, a reflection preventive film made of typically TiN (not shown) is formed on the aluminum based alloy layer 17 by sputtering, and the aluminum based alloy layer 17 and the metal backing layer 16 are patterned by photolithography and etching, to form an interconnection on the insulating layer 12. A structure shown in FIG. 6B is thus obtained.

In this example, as shown in FIG. 1, there occurs a reaction, similar to a silicide forming reaction, between the Si-rich layer formed on the surface of the insulating layer 12 and Ti, so that the orientation of Ti crystals along the (0002) face as the priority orientation face proceeds accompanied by re-arrangement of Ti atoms. As a result, crystals of the TiN layer formed on the Ti layer are oriented along the (111) face, and the degree of the crystal orientation of the aluminum based alloy layer formed on the TiN layer along the (111) face is enhanced. Thus, the interconnection having a high reliability can be formed.

EXAMPLE 2

In this example, the surface of an insulating layer is degassed, and is subjected to sputter-etch cleaning with a vacuum state being kept, before formation of an interconnection material layer by sputtering. Differently from Example 1, a so-called high pressure reflow process is adopted in this example. The high pressure reflow process includes steps of forming an opening portion in an insulating layer, depositing an interconnection material layer on the insulating layer including the interior of the opening portion by sputtering, and heating the interconnection material layer at a pressurized state. In such a high pressure reflow process, the interior of the opening portion is buried with the interconnection material layer and thereby a via-hole is formed. The above interconnection material layer has a metal backing layer of TiN (upper layer)/Ti (lower layer), and an aluminum based alloy layer formed thereon. Hereinafter, a process of forming an interconnection of a semiconductor device in this example will be described with reference to FIGS. 7A, 7B and FIGS. 8A, 8B. In addition, the sputtering system shown in FIGS. 3 and 4 is used in this example.

[Step-200]

Figure 7A:
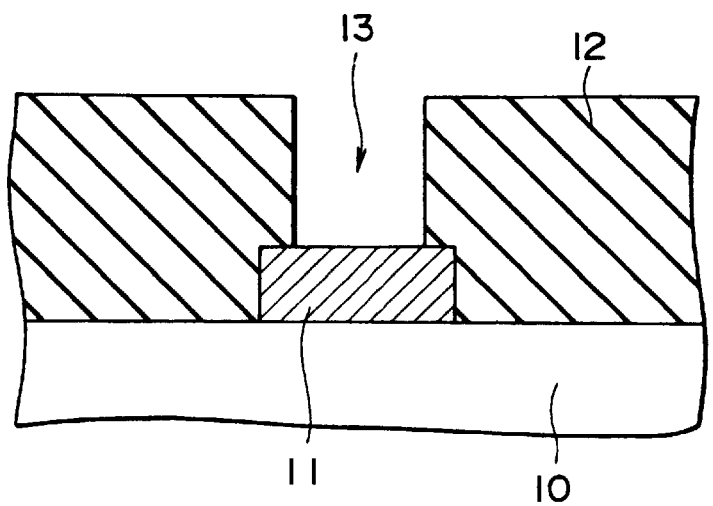
FIGS. 7A and 7B are partial sectional views each typically showing a structure of a semiconductor device including a base body and the like for illustrating steps of forming an interconnection of a semiconductor device according to a second example.
Figure 7B:
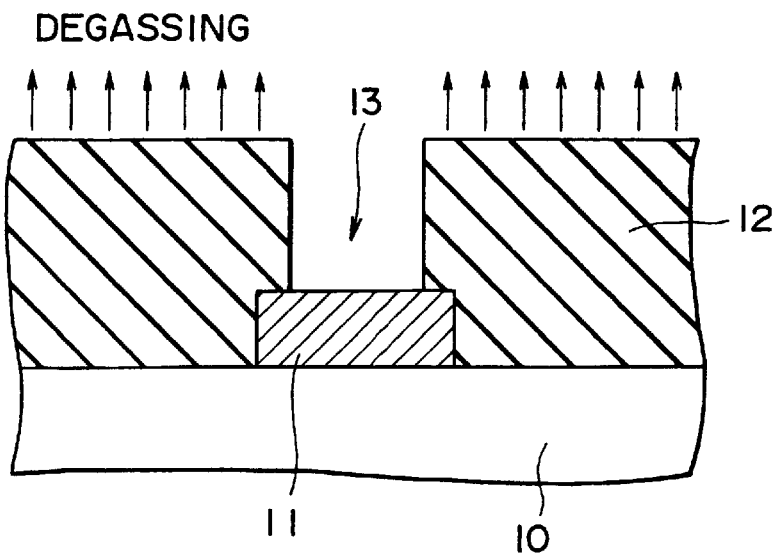

First, in the same manner as that at [Step-100] of Example 1, a transistor element is formed on a semiconductor substrate in accordance with a known process, and then a lower insulating layer 10 is formed over the entire surface. A lower interconnection layer 11 is formed on the lower insulating layer 10. An insulating layer 12 made of $SiO_2$ is then formed over the entire surface. Even in this example, the lower insulating layer 10 and the lower interconnection layer 11 constitute a base body. An opening portion 13 is formed in the insulating layer 12 at a position over the lower interconnection layer 11 by photolithography and etching. A structure shown in FIG. 7A is thus obtained.

[Step-210]

A plurality of the semiconductor substrates thus prepared are contained in a wafer cassette, and are carried into the degassing chamber 40 of the sputtering system shown in FIG. 3 through the loading chambers 30A and 30B using a carrying means. While the semiconductor substrates are carried, the gate valve between the sputter-etch cleaning chamber 50 and the first carrying path 32 is closed, and also the gate valve between the first carrying path 32 and the second carrying path 34 is closed. After the semiconductor substrates are carried in the degassing chamber 40, the gate valve between the first carrying path 32 and the degassing chamber 40 is closed. Then, the interior of the degassing chamber 40 is heated by a heater (not shown) and a heating gas is introduced into the degassing chamber 40. The insulating layer 12 of each semiconductor substrate is heated at 480° C. for degassing the insulating layer 12 (see FIG. 7B). Moisture is thus discharged from the insulating layer 12 by degassing. The heating temperature in degassing may be suitably selected on the basis of various experiments and experiences. For the $SiO_2$ based insulating layer, when it is heated at about 200° C., moisture adsorbed on the surface of the insulating layer in the atmospheric air is started to be discharged therefrom. When the insulating layer is heated at about 400° C., moisture produced by dehydration condensation of OH-groups is started to be discharged from the interior of the insulating layer. The control or management of the discharge of the above moisture by degassing is very difficult because the degree of the degassing is dependent on the delicate film formation condition and the rest time in the atmospheric air. The degassing, however, is effective to suppress discharge of moisture from the insulating layer 12 in the subsequent steps, and hence to effectively prevent re-oxidation of a Si-rich layer formed on the surface of the insulating layer by sputter-etch cleaning.

[Step-220]

The gate valve between the degassing chamber 40 and the first carrying path 32 is opened, and one of the semiconductor substrates is taken from the degassing chamber 40. In addition, the gate valve between the first carrying path 32 and the sputter-etch cleaning chamber 50 is left closed. After that, the gate valve between the degassing chamber 40 and the first carrying path 32 is closed, and the gate valve between the first carrying path 32 and the sputter-etch cleaning chamber 50 is opened. The semiconductor substrate is then carried into the sputter-etch cleaning chamber 50 using the carrying means, and the gate valve between the first carrying path 32 and the sputter-etch cleaning chamber 50 is closed.

Before formation of an interconnection material layer by sputtering, the surface of the insulating layer 12 and the surface of the lower interconnection layer 11 exposed at the bottom portion of the opening portion 13 are subjected to sputter-etch cleaning while the base body is cooled in the same condition as that at [Step-120]. Thus, an oxide film on the surface of the lower interconnection layer 11 at the bottom portion of the opening portion 13 is removed, and at the same time a Si-rich layer (not shown) is formed on the surface of the insulating layer 12.

[Step-230]

An interconnection material layer is formed on the insulating layer 12 by sputtering. Specifically, the gate valve between the first carrying path 32 and the sputter-etch cleaning chamber 50 is opened for carrying the semiconductor substrate from the sputter-etch cleaning chamber 50 into the first carrying path 32, and the gate valve between the first carrying path 32 and the sputter-etch cleaning chamber 50 is closed. Next, the gate valve between the first carrying path 32 and the second carrying path 34 is opened for carrying the semiconductor substrate into the second carrying path 34, and the gate valve between the first carrying path 32 and the second carrying path 34 is closed. Then, the gate valve between the second carrying path 34 and the first sputtering chamber 60 is opened for carrying the semiconductor substrate into the first sputtering chamber 60, and the gate valve between the second carrying path 34 and the first sputtering chamber 60 is closed.

An interconnection material layer is formed on the insulating layer 12 by sputtering. Specifically, a metal backing layer 20 composed of a Ti layer (thickness: 20 nm) and a TiN layer (thickness: 50 nm) is formed on the insulating layer 12 including the interior of the opening portion 13 by sputtering. The metal backing layer 20 is preferably formed by collimated sputtering. The metal backing layer 20 is provided for improving the degree of crystal orientation of an aluminum based alloy layer 21, stress-migration resistance thereof, and wettability thereof upon high pressure reflow. The film formation conditions of the Ti layer and TiN layer may be the same as the film formation condition of the Ti layer at [Step-130] in Example 1 and the film formation condition of the adhesive layer made of TiN at [step-10] in Example 1, respectively.

The gate valve between the second carrying path 34 and the first sputtering chamber 60 is then opened for carrying the semiconductor substrate in the second carrying path 34. The gate valve between the second carrying path 34 and the first sputtering chamber 60 is closed, and the gate valve between the second carrying path 34 and the second sputtering chamber 63 is opened for carrying the semiconductor substrate into the second sputtering chamber 63. After that, the gate valve between the second carrying path 34 and the second sputtering chamber 63 is closed.

Figure 8A:
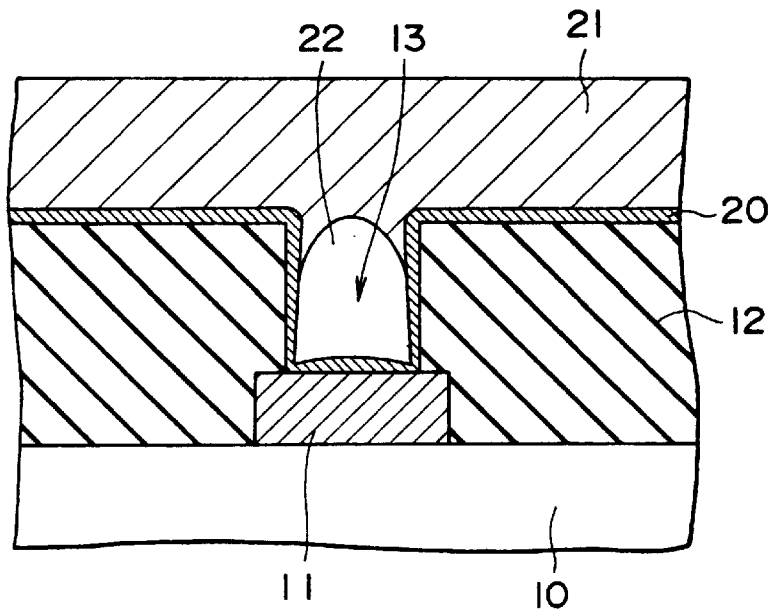
FIGS. 8A and 8B are partial sectional views, similar to FIGS. 7A and 7B, for illustrating steps continued from the step shown in FIGS. 7A and 7B.
Figure 8B:
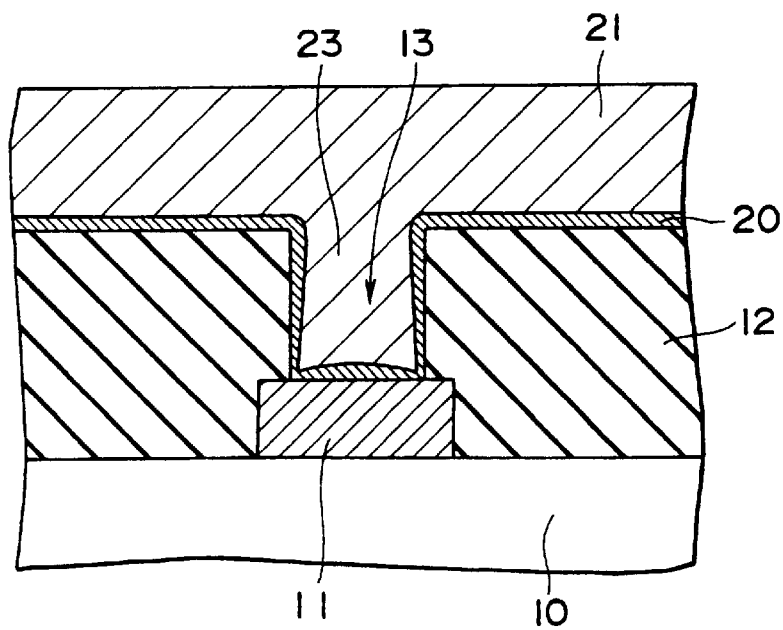
Figure 9:
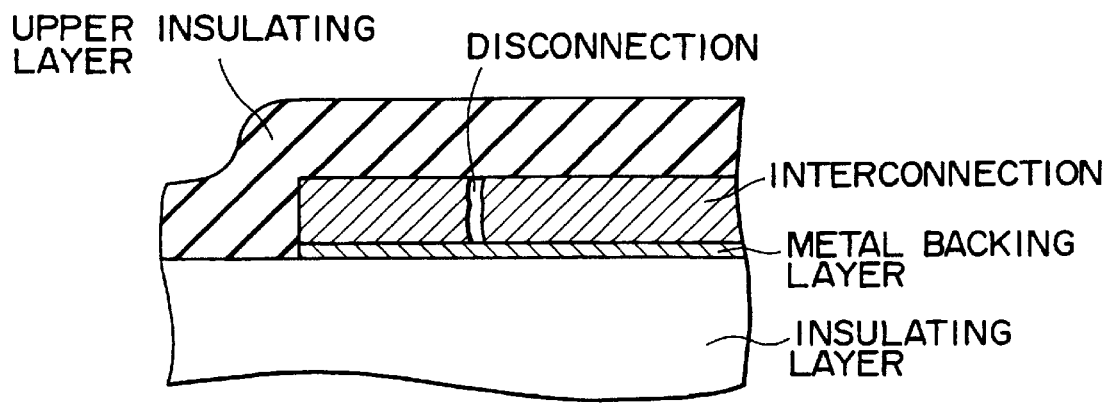
FIG. 9 is a partial sectional view typically showing an interconnection having a laminated metal structure intended to prevent stress-migration.

An aluminum based alloy 21 made of Al-0.5%Cu (thickness: 0.5 μm) is deposited on the metal backing layer 20 by sputtering (see FIG. 8A). The sputtering condition of the aluminum based alloy layer 21 is shown in the following. In addition, the metal backing layer 20 is shown as one layer for simplicity.

(Sputtering condition of aluminum based alloy layer)
Gas used: Ar=100 sccm
Pressure: 0.4 Pa
DC power: 20 kW
Substrate heating temperature: 400° C.

Figure 10:
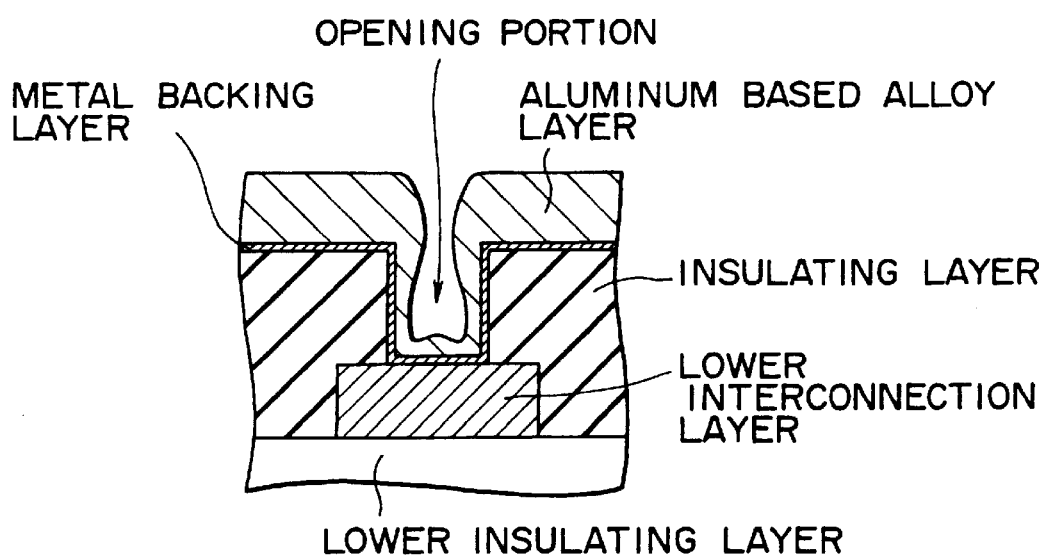
FIG. 10 is a partial sectional view typically showing an interconnection material layer which cannot be positively buried in an opening portion by high pressure reflow.

The substrate heating temperature in Example 2 is higher than that in Example 1. In the high pressure reflow process for the aluminum based alloy layer 21, the aluminum based alloy layer 21 is buried in the opening portion 13 using a high pressure gas. Accordingly, the aluminum based alloy layer 21 is desired to be formed in such a bridge shape as to block the upper portion of the opening portion 13 with a void 22 being left in the opening portion 13, as shown in FIG. 8A. If the aluminum based alloy layer 21 is formed in such a shape as shown in FIG. 10, there is a fear that the aluminum based alloy layer 21 is not positively buried into the opening portion 13. The aluminum based alloy layer 21 can be formed in such a bridge shape by setting the substrate heating temperature at a high value upon formation of the aluminum based alloy layer 21 for deforming the aluminum based alloy layer 21 through surface tension of the aluminum based alloy constituting the aluminum based alloy layer 21.

[Step-240]

The aluminum based alloy layer 21 is then subjected to high pressure reflow. Specifically, the gate valve between the second carrying path 34 and the second sputtering chamber 63 is opened for carrying the semiconductor substrate into the second carrying path 34. The gate valve between the second carrying path 34 and the second sputtering chamber 63 is closed, and the gate valve between the second carrying path 34 and the high pressure reflow chamber 70 is opened for carrying the semiconductor substrate into the high pressure reflow chamber 70. After that the gate valve between the second carrying path 34 and the high pressure reflow chamber 70 is closed.

The aluminum based alloy layer 21 is heated in a pressurized state. Thus, the opening portion 13 is buried with the aluminum based alloy layer 21, to form a via-hole 23 (see FIG. 8B). The condition of high pressure reflow is as follows:

Atmosphere: argon gas, $10^6$ Pa or more
Substrate heating temperature: 450° C.
heating time: 2 minutes Upon film formation of the metal backing layer 20, upon film formation of the aluminum alloy layer 21, and upon high pressure reflow, the temperature of the insulating layer 12 must not exceed the heating temperature (480° C.) of the insulating layer at [Step-210]. The reason for this is that if the temperature of the insulating layer 12 in the above treatment exceeds the heating temperature of the insulating layer 12 at [Step-210], there is a fear that a gas is discharged from the insulating layer 12. In the above film formation condition of the aluminum based alloy layer 21, the temperature of the aluminum based alloy layer 21, which is being formed on the insulating film 12, does not exceed 480° C.

The semiconductor substrate is carried from the high pressure reflow chamber 70 into the degassing chamber 40 through the second carrying path 34 and the first carrying path 32, and is contained in the wafer cassette placed in the degassing chamber 40. The above [Step-220], [Step-230] and [Step-240] are then repeated for the remaining semiconductor substrates contained in the wafer cassette. The wafer cassette containing the semiconductor substrates thus processed is carried out of the system through the loading chambers 30A and 30B.

[Step-250]

After that, the aluminum based alloy layer 21 and the metal backing layer 20 on the insulating layer 12 are patterned to form an interconnection. Specifically, a reflection preventive film made of typically TiN is formed on the aluminum based alloy layer 21 by sputtering, and the aluminum based alloy layer 21 and the metal backing layer 20 are patterned by photolithography and etching, to form an interconnection on the insulating layer 12.

Even in Example 2, there occurs a reaction, similar to a silicide forming reaction, between the Si-rich layer formed on the surface of the insulating layer 12 and Ti, so that the orientation of Ti crystals along the (0002) face as the priority orientation face proceeds accompanied by re-arrangement of Ti atoms. As a result, crystals of the TiN layer formed on the Ti layer are oriented along the (111) face, and the degree of the crystal orientation of the aluminum based alloy layer formed on the TiN layer along the (111) face is enhanced. The interconnection having a high reliability can be thus formed. Further, in this example, since there occurs no or little discharge of gas from the insulating layer 12 after [Step-220], an interconnection having a high crystal orientation and a high reliability can be stably formed. Also, in this example, it is possible to positively bury the opening portion with an interconnection material layer by high pressure reflow, and hence to stably form a via-hole.

Although the process of forming an interconnection of a semiconductor device according to the present invention has been described with reference to the examples using the sputtering system according to the embodiment of the present invention, such description is for illustrative purposes only, and it is to be understood that the structure of the sputtering system can be suitably changed and also the various conditions and interconnection structures described in the examples can be suitably changed. For example, although the base body is composed of the lower insulating layer 10 and the lower interconnection layer 11 in the examples, it may be composed of a semiconductor substrate formed with a diffusion layer and a source/drain region. The interconnection material layer may be of a Ti single layer structure or a laminated structure of Ti and TiN. Even in this case, the degree of crystal orientation of the Ti layer can be enhanced, and thereby the reliability of the interconnection material layer made of such a material can be improved.

Although the via-hole is formed by high pressure reflow in Example 2, it can be formed by a reflow process by suitably setting the substrate heating temperature upon film formation of an aluminum based alloy layer by sputtering. The via-hole can be also formed by high temperature sputtering. For example, at [Step-230] of Example 2, a semiconductor substrate is heated at a suitable temperature and an aluminum based alloy layer made of Al-0.5% Cu is deposited on a metal backing layer by sputtering. In this case, the aluminum based alloy layer formed on the insulating layer (more concretely, on the metal backing layer) is fluidized, and it flows in an opening portion. As a result, the opening portion is buried with the aluminum based alloy constituting the aluminum based alloy layer, to form a via-hole. The high temperature sputtering condition of the aluminum based alloy layer is shown in the following. In this case, the degassing for the insulating layer is performed by heating the insulating layer at 480° C. at [Step-210] of Example 2.

(Sputtering condition of aluminum based alloy layer)

Gas used: Ar=100 sccm

Pressure: 0.4 Pa

DC power: 20 kW

Substrate heating temperature: 470° C.

Although the adhesive layer 14 is formed by sputtering on the insulating layer 12 including the interior of the opening portion 13 at [Step-110] of Example 1, it may be formed of TiN using ECR-CVD in the following condition.

(ECR-CVD condition of TiN)

Gas used: $TiCl_4/H_2/N_2$=20/26/8 sccm

Microwave power: 2.8 kW

Substrate RF bias: −50 W

Temperature: 420° C.

Pressure: 0.12 Pa

Further, in place of burying the opening portion with tungsten at [Step-10] of Example 1, the opening portion can be buried with copper by CVD in the following condition. In addition, HFA is the abbreviation of hexafluoroacetylacetonato.

(CVD condition of copper)

Gas used: $Cu(HFA)_2/H_2$=10/1000 sccm

Pressure: $2.6 \times 10^3$ Pa

Substrate heating temperature: 350° C.

Power: 500 W

What is claimed is:

1. A process of forming an interconnection of a semiconductor device, comprising:

a first step of forming an insulating layer made of a silicon based material on a base body;

a second step of sputter-etch cleaning the surface of said insulating layer;

a third step of depositing an interconnection material layer on said insulating layer by sputtering; and a fourth step of patterning said interconnection material layer on said insulating layer, thereby forming an interconnection;

wherein the sputter-etch cleaning in said second step is performed while said base body is cooled by contacting a cooling stage.

2. A process of forming an interconnection of a semiconductor device according to claim 1, wherein the temperature of said base body in said second step is controlled to be 100° C. or less.

3. A process of forming an interconnection of a semiconductor device according to claim 1, further comprising, between said first and second steps, a step of degassing said insulating layer by heating said insulating layer.

4. A process of forming an interconnection of a semiconductor device according to claim 1, wherein said base body is kept under a reduced pressure in a period from the start of said second step to the end of said third step.

5. A process of forming an interconnection of a semiconductor device according to claim 1, wherein said interconnection material layer comprises a metal backing layer made of at least Ti, and an aluminum based alloy layer formed on said metal backing layer.

6. A process of forming an interconnection of a semiconductor device according to claim 5, wherein said aluminum based alloy layer is formed by sputtering, and said opening portion is buried with said aluminum based alloy layer by high pressure reflow of said aluminum based alloy layer at a high temperature.

* * * * *